United States Patent [19]

Kato

[11] Patent Number: 5,334,977
[45] Date of Patent: Aug. 2, 1994

[54] ADPCM TRANSCODER WHEREIN DIFFERENT BIT NUMBERS ARE USED IN CODE CONVERSION

[75] Inventor: Tadaharu Kato, Tokyo, Japan
[73] Assignee: NEC Corporation, Tokyo, Japan
[21] Appl. No.: 848,520
[22] Filed: Mar. 9, 1992

[30] Foreign Application Priority Data

Mar. 8, 1991 [JP] Japan .................................. 3-103277
Mar. 8, 1991 [JP] Japan .................................. 3-103278

[51] Int. Cl.⁵ .............................................. H03M 7/34
[52] U.S. Cl. ............................................ 341/76; 375/27
[58] Field of Search ....................... 341/53, 76; 375/27; 358/135

[56] References Cited

U.S. PATENT DOCUMENTS

| | | | |
|---|---|---|---|
| 3,772,682 | 11/1973 | Flanagan | 341/76 |
| 4,475,213 | 10/1984 | Medaugh | 375/27 |
| 4,677,423 | 6/1987 | Benvenuto et al. | 341/76 |
| 4,839,897 | 6/1989 | Aoki | 371/68 |
| 4,860,313 | 8/1989 | Shpiro | 375/27 |
| 4,860,315 | 8/1989 | Hosoda et al. | 375/30 |

OTHER PUBLICATIONS

CCITT, (International Telegram and Telephone Consultative Committee) Recommendation G.761, pp. 482-497.

Primary Examiner—Marc Hoff
Attorney, Agent, or Firm—Whitham, Curtis & Whitham

[57] ABSTRACT

For transmission and reception of an ADPCM stream in which each of signal components is represented by a predetermined number of bits, an ADPCM transcoder comprises a bit number determining device (43) for producing a bit number signal representative of first and second bit numbers one at a time to make the ADPCM stream carry a voice component with the first bit number and a data component with the second bit number as two of the signal components. The first bit number is less than the second bit number. Preferably, a sum of the first and the second bit numbers is not greater than twice the predetermined number to make one of the two signal components comprise the voice component and a less significant part of the data component. The first and the second bit numbers are calculated from a voice and a data optimum scale factor which can be calculated by a method similar to adaptive prediction. The bit number signal need not be carried by the ADPCM stream. Alternatively, the transcoder may multiplex the bit number signal in the ADPCM stream for transmission and demultiplex the bit number signal from the ADPCM stream received to determine the first and the second bit numbers for use in an ADPCM decoder included therein.

9 Claims, 6 Drawing Sheets

| TIME SLOT | | 0 | 1 | 2 | 3 | 4 |
|---|---|---|---|---|---|---|
| BITS | 1<br>2<br>3<br>4 | -- | 1A | 1B | 3A | 3B |
| BITS | 5<br>6<br>7<br>8 | -- | 2A<br>1A(5) | 2B | 4A | 4B |

(B)

| 5 | 6 | 7 | 8 | 9 | 10 | 11 | 12 | 13 |
|---|---|---|---|---|---|---|---|---|
| 5A<br>6A(5) | 5B | 7A | 7B | 9A | 9B | 11A | 11B | 13A |
| 6A | 6B | 8A | 8B | 10A | 10B | 12A | 12B | 14A |

(C)

| 14 | 15 | 16 | 17 | 18 | 19 | 20 | 21 | 22 |
|---|---|---|---|---|---|---|---|---|
| 13B | 15A | -- | 15B | 17A | 17B | 19A | 19B | 21A |
| 14B | 16A | -- | 16B | 18A | 18B | 20A | 20B | 22A |

(D)

| 23 | 24 | 25 | 26 | 27 | 28 | 29 | 30 | 31 |
|---|---|---|---|---|---|---|---|---|
| 21B | 23A | 23B | 25A | 25B | 27A | 27B | 29A | 29B |
| 22B | 24A | 24B | 26A | 26B | 28A | 28B | 30A | 30B |

| | BIT NUMBER | | | | | | | |
|---|---|---|---|---|---|---|---|---|
| | 1 | 2 | 3 | 4 | 5 | 6 | 7 | 8 |
| CASE (I) | S1 | 0 | 0 | 1 | 1 | 0 | 1 | 1 |
| CASE (II) | S1 | 1 | RMT A | RMT B | TRS A | TRS B | AIS A | AIS B |

FIG. 6

| | | FRAME NO. | BIT NUMBER | | | | | | | |
|---|---|---|---|---|---|---|---|---|---|---|
| | | | 1 | 2 | 3 | 4 | 5 | 6 | 7 | 8 |
| MULTI-FRAME | SUB-MULTI-FRAME | 0 | C1 | 0 | 0 | 1 | 1 | 0 | 1 | 1 |
| | | 1 | 0 | 1 | A1 | A2 | A3 | A4 | A5 | A6 |
| | | 2 | C2 | 0 | 0 | 1 | 1 | 0 | 1 | 1 |
| | | 3 | 0 | 1 | A7 | A8 | A9 | A10 | A11 | A12 |
| | | 4 | C3 | 0 | 0 | 1 | 1 | 0 | 1 | 1 |
| | | 5 | 1 | 1 | RMT A | RMT B | A13 | A14 | AIS A | AIS B |
| | | 6 | C4 | 0 | 0 | 1 | 1 | 0 | 1 | 1 |
| | | 7 | 0 | 1 | RMT A | RMT B | A15 | TRS A | AIS A | AIS B |
| | SUB-MULTI-FRAME | 8 | C1 | 0 | 0 | 1 | 1 | 0 | 1 | 1 |
| | | 9 | 1 | 1 | B1 | B2 | B3 | B4 | B5 | B6 |
| | | 10 | C2 | 0 | 0 | 1 | 1 | 0 | 1 | 1 |
| | | 11 | 1 | 1 | B7 | B8 | B9 | B10 | B11 | B12 |
| | | 12 | C3 | 0 | 0 | 1 | 1 | 0 | 1 | 1 |
| | | 13 | Si | 1 | RMT A | RMT B | B13 | B14 | AIS A | AIS B |
| | | 14 | C4 | 0 | 0 | 1 | 1 | 0 | 1 | 1 |
| | | 15 | Si | 1 | RMT A | RMT B | B15 | TRS A | AIS A | AIS B |

ADPCM TRANSCODER WHEREIN DIFFERENT BIT NUMBERS ARE USED IN CODE CONVERSION

BACKGROUND OF THE INVENTION

This invention relates to an ADPCM (adaptive differential pulse code modulation) transcoder which is for use in code converting between two PCM streams and one adaptive differential PCM stream, namely, which is for code conversion from two PCM streams to one adaptive differential PCM stream and from one adaptive differential PCM stream to two PCM streams.

Such an adaptive differential PCM transcoder is used in an adaptive differential PCM signal transmission network together with other similar adaptive differential PCM transcoders. When taken into consideration, one of the adaptive differential PCM transcoders of the transmission network will be called a local transcoder. Other adaptive differential PCM transcoders are remote transcoders. The local transcoder is for transmitting an adaptive differential PCM stream to a counterpart transcoder of the remote transcoders and for receiving an adaptive differential PCM stream from the counterpart transcoder.

In the manner known in the art, a plurality of baseband signals are multiplexed into each PCM stream. The baseband signals may comprise a voice or voice sound signal and a data or modem signal in an audio frequency band. The modem signal in the audio frequency band will herein be referred to merely as a data signal. Each PCM signal carries the voice signal as a voice or voice signal component. Similarly, the data signal is carried as a data or data signal component.

When supplied to the local transcoder, the two PCM streams will be called first and second input PCM streams. When transmitted from the local transcoder towards the counterpart transcoder, the adaptive differential PCM stream will be called an outgoing adaptive differential PCM stream. When received from the counterpart transcoder, the adaptive differential PCM stream will be called an incoming adaptive differential PCM stream. When converted by the local transcoder from the incoming adaptive differential PCM stream, the two PCM streams will be called first and second output PCM streams.

According to CCITT (International Telegram and Telephone Consultative Committee) Recommendation G.761, each of the first and the second input and output PCM streams carries the baseband signals, thirty channels in number. Each of the outgoing and the incoming adaptive differential PCM streams carries the baseband signals, sixty channels in number. Each of the first and the second input and output PCM streams and the outgoing and the incoming adaptive differential PCM streams has a bit rate of 2048 kbit/s. Each time slot of the first and the second input and output PCM streams consists of eight bit. Each time slot of the outgoing and the incoming adaptive differential PCM streams consists of four bits per channel.

It is known in the art that an adaptive differential PCM transcoder comprises, when used on a send side, an adaptive differential PCM encoder device for encoding two PCM sequences into one or single adaptive differential PCM sequence. A format transforming device is used in format transforming the two input PCM streams into the two PCM sequences and the single adaptive differential PCM sequence into the outgoing adaptive differential PCM stream. When used on a receive side, the adaptive differential PCM transcoder comprises an adaptive differential PCM decoder device for decoding one or sole adaptive differential PCM sequence into two decoded PCM sequences. The format transforming device is used in format transforming the incoming adaptive differential PCM stream into the sole adaptive differential PCM sequence and the two docoded PCM sequences into the two output PCM streams.

It is usual in the art to refer to a combination of an encoder and a decoder as a codec. As a consequence, a combination of the encoding device and the decoding device is herein called a codec device.

A combination of the adaptive differential PCM codec device and the format transforming device is for carrying out the code conversion between two PCM streams and one adaptive differential PCM stream by using an adaptive differential PCM coding algorithm. It is preferred to use an adaptive differential PCM coding algorithm defined by CCITT Recommendation G.721. This, however, makes it impossible to excellently transmit as an adaptive differential PCM stream a data signal having a bit rate which is higher than 9600 b/s.

In order to make it possible to deal with a data signal having a bit rate higher than 9600 b/s, the code conversion is often carried out by using an adaptive differential PCM coding algorithm which is developed individually by a manufacturer of adaptive differential PCM transcoders. This, however, renders the adaptive differential PCM transcoder incompatible with adaptive differential PCM transcoders manufactured by other makers.

Incidentally, the adaptive differential PCM coding algorithm makes use of a scale factor, which is a coefficient used on determining quantization step sizes used on code converting between two PCM streams and one adaptive differential PCM stream. The scale factor is preferably calculated according to adaptive prediction. In such an event, the scale factor is variable depending on a variance which each baseband signal has.

At any rate, a conventional adaptive differential PCM transcoder is defective in that it gives an adaptive differential PCM signal transmission network an objectionable transmission characteristic when the Recommendation G.721 is resorted to. The conventional adaptive differential PCM transcoder is moreover defective in its compatibility with adaptive differential PCM transcoders manufactured by others when the transcoder in question is operable in compliance with an adaptive differential PCM coding algorithm developed by a particular manufacturer.

SUMMARY OF THE INVENTION

It is consequently an object of the present invention to provide an adaptive differential PCM transcoder which can give an excellent transmission characteristic to an adaptive differential PCM signal transmission network.

It is another object of this invention to provide an adaptive differential PCM transcoder which is of the type described and is compatible with adaptive differential PCM transcoders manufactured by other makers.

It is still another object of this invention to provide an adaptive differential PCM transcoder which is of the type described and is for code converting two PCM streams to one adaptive differential PCM stream when used on a send side.

It is yet another object of this invention to provide an adaptive differential PCM transcoder which is of the type described and is for code converting an adaptive differential PCM stream to two PCM streams when used on a receive side.

Other objects of this invention will become clear as the description proceeds.

On setting forth the gist which is common to two aspects of this invention, it is possible to understand that an adaptive differential PCM transcoder is for code converting two PCM streams into one adaptive differential PCM stream and includes an adaptive differential PCM encoder device for encoding two PCM sequences into one adaptive differential PCM sequence and a format transforming device for format transforming the two PCM streams into the two PCM sequences and the adaptive differential PCM sequence into the adaptive differential PCM stream.

According to each of the two aspects being in consideration, the adaptive differential PCM transcoder comprises: (A) a scale factor calculating device for using the adaptive differential PCM sequence in calculating a voice optimum scale factor and a data optimum scale factor; (B) a judging device for comparing the data optimum scale factor with a predetermined threshold value to judge presence and absence of a data component in the two PCM sequences; (C) a bit number determining device for selecting a bit number in accordance with the absence and the presence of the data component to produce a bit number signal representative of the bit number; (D) a first connection for supplying the bit number signal to the adaptive differential PCM encoder device to make the adaptive differential PCM encoder device use the bit number on encoding the two PCM sequences into the adaptive differential PCM sequence; and (E) a second connection for supplying the bit number signal to the format transforming device to make the format transforming device use the bit number on format transforming the adaptive differential PCM sequence into the adaptive differential PCM stream.

According to one of the two aspects of this invention, the second connection is for making the format transforming device produce the adaptive differential PCM stream without using the bit number signal as a signal component of the adaptive differential PCM stream.

On setting forth the gist of a different one of the two aspects of this invention, it is possible to understand that the adaptive differential PCM stream comprises signal components arranged in frames.

According to the different one of the two aspects of this invention, the second connection is for making the format transforming device produce the adaptive differential PCM stream by making a predetermined one of the signal components in each of the frames represent the bit number signal.

On setting forth the gist of a different aspect of this invention, it is possible to understand that an adaptive differential PCM transcoder is for code converting one adaptive differential PCM stream to two PCM streams and includes an adaptive differential PCM decoder device for decoding one adaptive differential PCM sequence into two PCM sequences and a format transforming device for format transforming the adatpive differential PCM stream into the adaptive differential PCM sequence and the two PCM sequences into the two PCM streams.

According to the different aspect of this invention, the above-understood adaptive differential PCM transcoder comprises: (A) a scale factor calculating device for using the adaptive differential PCM sequence in calculating a voice optimum scale factor and a data optimum scale factor; (B) a judging device for comparing the data optimum scale factor with a predetermined threshold value to judge presence and absence of a data component in the adaptive differential PCM sequence; (C) a bit number determining device for calculating a bit number in accordance with the absence and the presence of the data component to produce a bit number signal representative of the bit number; (D) a first connection for supplying the bit number signal to the format transforming device to make the format transforming device use the bit number on format transforming the adaptive differential PCM stream into the adaptive differential PCM sequence; and (E) a second connection for supplying the bit number signal to the adaptive differential PCM decoder device to make the adaptive differential PCM decoder device use the bit number on decoding the adaptive differential PCM sequence into the two PCM sequences.

On setting forth the gist of a further different aspect of this invention, it is possible to understand that an adaptive differential PCM transcoder is for code converting one adaptive differential PCM stream to two PCM streams and includes an adaptive differential PCM decoder device for decoding one adaptive differential PCM sequence into two PCM sequences and a format transforming device for format transforming the adaptive differential PCM stream into the adaptive differential PCM sequence and the two PCM sequences into the two PCM streams.

According to the further different aspect of this invention, (I) the format transforming device is for format transforming the adaptive differential PCM stream furthermore to a bit number signal representative of a bit number; (II) the above-understood adaptive differential PCM transcoder comprising: (A) a bit number determining device for using the bit number signal in determining a decoded number to produce a bit number control signal representative of the decoded number; and (B) a connection for supplying the bit number control signal to the adaptive differential PCM decoder device to make the adaptive differential PCM decoder device use the decoded number on decoding the adaptive differential PCM sequence into the two PCM sequences.

It will now be readily understood that an adaptive differential PCM transcoder may comprise the adaptive differential PCM encoder and decoder devices recited in the above-mentioned one of the two aspects of this invention and in the different aspect of this invention. Alternatively, the adaptive differential PCM transcoder may comprise the adaptive differential PCM encoder and decoder devices recited in the different one of the two aspects of this invention and in the further different aspect of this invention.

DESCRIPTION OF THE PREFERRED EMBODIMENTS

Figure 1:
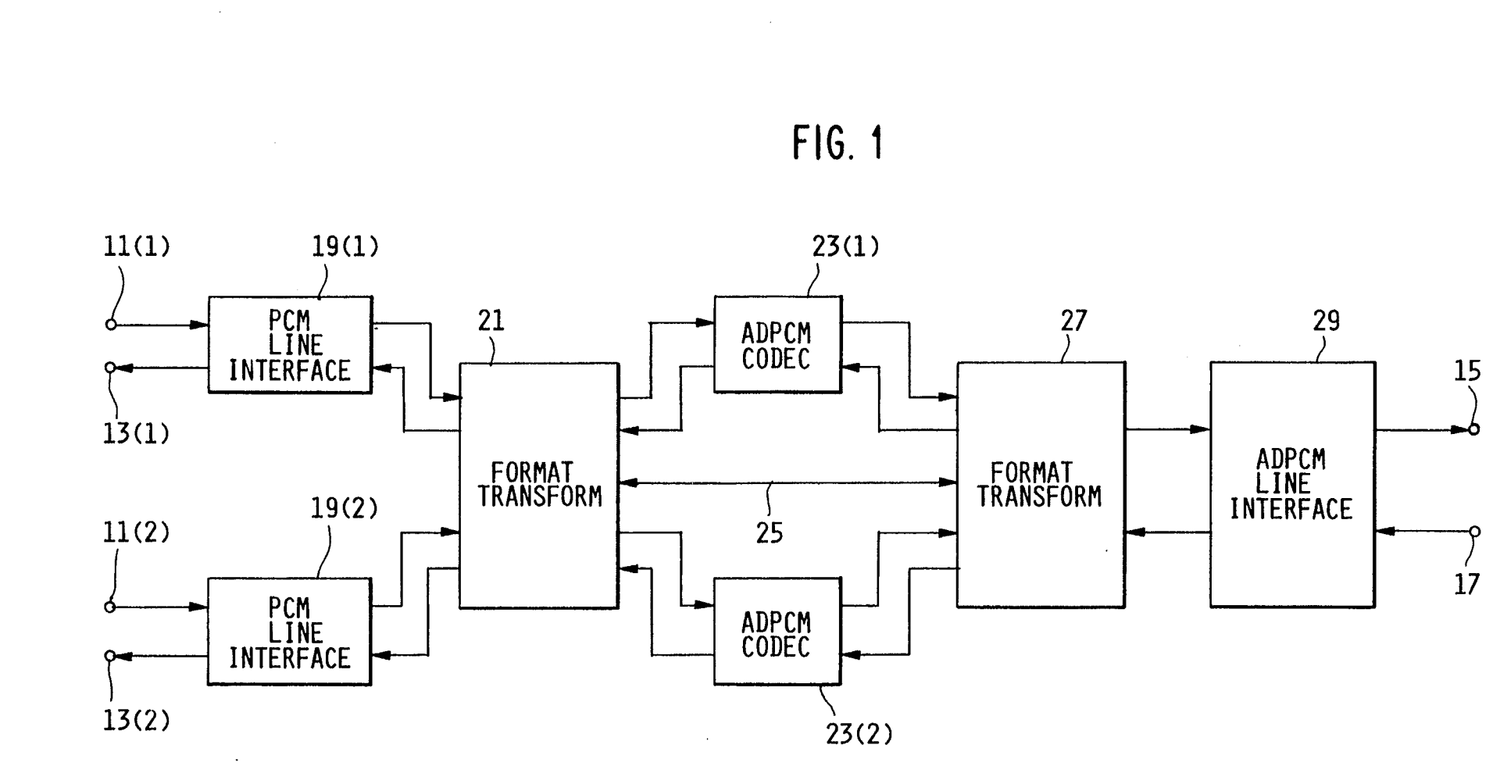
FIG. 1 is a block diagram of an adaptive differential PCM transcoder to which the instant invention is applicable.

Referring to FIG. 1, attention will be directed to a general ADPCM (adaptive differential pulse code modulation) transcoder to which the present invention is applicable. The adaptive differential PCM transcoder is for use as a local transcoder in an adaptive differential PCM signal transmission network which additionally comprises other similar adaptive differential PCM transcoders (not shown) as remote transcoders. The local transcoder is for transmitting an adaptive differential PCM stream to one of the remote transcoders that is used as a counterpart transcoder. Furthermore, the local transcoder is for receiving a similar adaptive differential PCM stream either from the counterpart transcoder or another of the remote transcoders that may be referred to also as a counterpart transcoder.

In general, the adaptive differential PCM transcoder has first and second input terminals 11(1) and 11(2), first and second output terminals 13(1) and 13(2), and outgoing and incoming terminals 15 and 17. The first and the second input terminals 11 (suffixes omitted) are for receiving first and second input PCM streams. The illustrated adaptive differential PCM transcoder is for delivering first and second output PCM streams to the first and the second output terminals 13 (suffixes omitted) and an outgoing adaptive differential PCM strem to the outgoing terminal 15 for transmission through the adaptive differential PCM signal transmission network towards at least one of the remote adaptive differential PCM transcoders. The incoming terminal 17 is for receiving an incoming adaptive differential PCM stream through the adaptive differential PCM signal transmission network.

It is known in the art that a plurality of baseband signals are multiplexed into each of the first and the second input and output PCM streams. The baseband signals may comprise a voice or voice sound signal and a data or modem signal in an audio frequency band. The modem signal in the audio frequency band will be referred to merely as a data signal. In each PCM stream, the voice signal results in a voice or voice signal component. The data signal brings about a data or data signal component.

The illustrated adaptive differential PCM transcoder is for code converting the first and the second input PCM streams to the outgoing adaptive differential PCM stream and the incoming adaptive differential PCM stream to the first and the second output PCM streams. In other words, the transcoder is for code conversion between two PCM streams and one adaptive differential PCM stream. The transcoder is operable on or as a send side of the local transcoder as well as on or as a receive side.

According to CCITT (International Telegram and Telephone Consultative Committee) Recommendation G.761, each PCM stream carries thirty-channel baseband signals. Each adaptive differential PCM stream carries sixty-channel baseband signals. Each of the PCM and the adaptive differential PCM streams has a bit rate of 2048 kbit/s. Each time slot of each PCM stream consists of eight bits. Each time slot of each adaptive differential PCM stream channel consists of four bits. It may be pointed out here that each input PCM stream, as herein called, is called "an incoming PCM stream" in the Recommendation G.761.

In FIG. 1, first and second PCM line interface circuits 19(1) and 19(2) are connected to the first and the second input and output terminals 11 and 13. When the adaptive differential PCM transcoder is used as the send side, each of the PCM line interface circuits 19 (suffixes omitted) is for code converting transmission codes of each input PCM stream to internal codes which are used in the transcoder. The PCM line interface circuit 19 furthermore extracts alarm information from the input PCM stream and corrects synchronism in the input PCM streams.

A first format transforming circuit 21 is connected to the first and the second PCM line interface circuits 19. When the illustrated adaptive differential PCM transcoder is used as the send side, the first format transforming circuit 21 is used in extracting signalling information from the first and the second input PCM streams. The first format transforming circuit 21 additionally adjusts timing between the first and the second input PCM streams from which the alarm and the signalling information is extracted and which are synchronism adjusted. Such first and second input PCM streams will be called first and second PCM sequences and are herein referred to merely as two PCM sequences.

First and second adaptive differential PCM codecs 23(1) and 23(2) are connected to the first format transforming circuit 21 to receive the first and the second input PCM sequences when the adaptive differential PCM transcoder is used as the send side. In this event, each of the first and the second adaptive differential PCM codecs 23 (suffixes omitted) is for use as an adaptive differential PCM encoder in encoding the two PCM sequences supplied thereto into a partial adaptive differential PCM sequence which will become clear as the description proceeds. More particularly, the first and the second adaptive differential PCM codecs 23 are for producing first and second partial adaptive differential PCM sequences.

The first and the second adaptive differential PCM codecs 23 may alternatively be referred to either collectively or singly as an adaptive differential PCM codec device. When used in the send side, the adaptive differential PCM codec device (23) is herein called an adaptive differential PCM encoder device. The first and the second partial adaptive differential PCM sequences are collectively called one adaptive differential PCM sequence.

When used in the send side, a bidirectional connection 25 is for supplying a second format transforming circuit 27 with the signalling information from the first format transforming circuit 21 and the alarm information through the first format transforming circuit 21. The adaptive differential PCM encoder device (23) delivers the first and the second partial adaptive differential PCM sequences to the second format transforming circuit 27. Under the circumstances, the second format transforming circuit 27 is for arranging the partial adaptive differential PCM sequences and the alarm and the signalling information into one adaptive differential PCM stream in accordance with a signal format defined in the above-referenced Recommendation G.761.

A combination of the first and the second format transforming circuits 21 and 27 and the connection 25 serves as a format transforming device. When used in the send side, the format transforming device (21, 25, 27) format transforms the two PCM streams into the two PCM sequences and the above-mentioned one adaptive differential PCM sequence into the above-mentioned one adaptive differential PCM stream. It should be noted that the internal codes are still used in this adaptive differential PCM stream.

An adaptive differential PCM line interface circuit 29 is connected to the second format transforming circuit 27. The adaptive differential PCM line interface circuit 29 is for code converting the adaptive differential PCM stream to the outgoing adaptive differential PCM stream for delivery to the outgoing terminal 15 by code converting the internal codes to transmission codes which are used in the adaptive differential PCM signal transmission network.

When the illustrated adaptive differential PCM transcoder is used as the receive side, the adaptive differential PCM codec device serves as an adaptive differential PCM decoder device. In this instance, the adaptive differential PCM transcoder receives the incoming adaptive differential PCM stream at the incoming terminal 17 and code converts the incoming adaptive differential PCM stream to the first and the second output PCM streams for supply to the first and the second output terminals 13. Operation will later be described in detail.

In the manner described heretobefore, a combination of the adaptive differential PCM codec device (23) and the format transforming device (21, 25, 27) is for code conversion between two PCM straems and one adaptive differential PCM stream. It is preferred on carrying out the code conversion to resort to an adaptive differential PCM coding algorithm which is defined by CCITT Recommendation G.721 or G.723. This, however, makes it impossible to excellently transmit as an adaptive differential PCM stream a data signal having a bit rate which is higher than 9600 b/s.

In order to make it possible to deal with a data signal having a bit rate higher than 9600 b/s, the code conversion is often carried out by using an adaptive differential PCM coding algorithm which is developed individually by a manufacturer of adaptive differential PCM transcoders. This, however, renders the adaptive differential PCM transcoder under consideration incompatible with adaptive differential PCM transcoders which are additionally used in the adaptive differential PCM signal transmission network and are manufactured by other makers.

Figure 2:
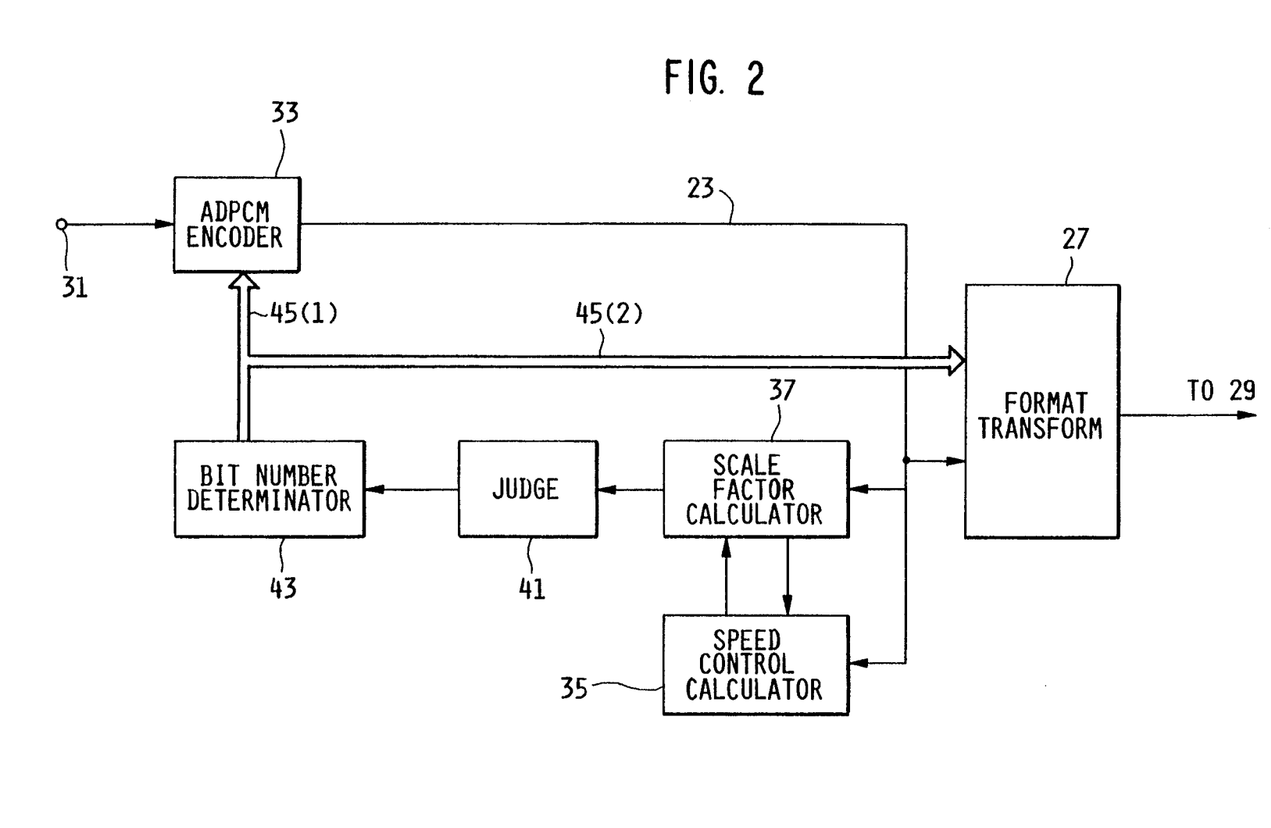
FIG. 2 is a block diagram of an encoder circuit for use in the adaptive differential PCM transcoder illustrated in FIG. 1 according to a first embodiment of this invention.

Referring now to FIG. 2, the description will proceed to an adaptive differential PCM transcoder which is used as an adaptive differential PCM encoder circuit according to a first embodiment of the present invention. The illustrated adaptive differential PCM transcoder comprises similar parts which are designated by like reference numerals and are similarly operable with likewise named signals. It should be noted in connection with FIGS. 1 and 2 that the first and the second input terminals 11, the outgoing terminal 15, the first format transforming circuit 21, and the bidirectional connection 25 are omitted in FIG. 2. Being not important parts insofar as this invention is concerned, the PCM and the adaptive differential PCM line interface circuits 19 and 29 are not illustrated.

In FIG. 2, a sender input terminal 31 is supplied from the first format transforming circuit 21 (FIG. 1) with the first and the second PCM sequences. Each of the first and the second adaptive differential PCM codecs 23 comprises an adaptive differential PCM encoder 33 which is connected to the sender input terminal 31 and is for encoding one of the two PCM sequences into one of the first and the second partial adaptive differential PCM sequences that is supplied to the second format transforming circuit 27 together with the other of the first and the second partial adaptive differential PCM sequences.

From the adaptive differential PCM encoder 33, the adaptive differential PCM sequence is delivered furthermore to a speed control calculating circuit 35 and to a scale factor calculating circuit 37. A combination of the speed control and the scale factor calculating circuits 35 and 37 serves as a scale factor calculating device. Using the adaptive differential PCM sequence and in the manner which will presently be described, the scale factor calculating device (35, 37) calculates a voice optimum scale factor and a data optimum scale factor.

It may be mentioned here that a scale factor is used on executing the adaptive differential PCM coding algorithm as a coefficient for use in determining quantization step sizes which are used in code conversion between the two PCM sequences and the adaptive differential PCM sequence. The scale factor is preferably calculated in accordance with adaptive prediction known in the art. In such an event, the scale factor is variable depending on a variance which each baseband signal has.

The voice signal has a great variance. In contrast, the data signal has a small variance. As a consequence, the scale factor is calculated according to this invention individually in connection with the voice and the data signals. Such scale factors are herein referred to as the voice optimum and the data optimum scale factors. In addition, a combination scale factor is calculated by the scale factor calculating device by a linear combination of the voice and the data optimum scale factors with first and second weights used in the linear combination of the voice and the data optimum scale factors.

It is possible to understand that the first weight grows when the voice signal is supplied as one of the baseband signals. The second weight grows when the data signal is used as one of the baseband signals. The voice optimum scale factor therefore follows a variation in the variance of each baseband signal more sensitively than the data optimum scale factor. Incidentally, the data optimum scale factor can be calculated by causing the voice optimum scale factor to pass through a low-pass filter (not shown).

In the scale factor calculating device, the speed control calculating circuit 35 uses the adaptive differential PCM sequence in calculating the first and the second weights in the manner which will shortly become clear. Using the adaptive differential PCM sequence and the first and the second weights, the scale factor calculating circuit 37 calculates the voice optimum, the data optimum, and the combination scale factors. The combination scale factor is supplied back to the speed control calculating circuit 35 and is additionally used in calculating the first and the second weights.

In this manner, signals are exchanged between the speed control and the scale factor calculating circuits 35 and 37. Calculation of the scale factor, however, converges within a time interval of one voice or data signal component (namely, within 125 microseconds).

It will be assumed that the format transforming device (21, 25, 27) format transforms between the two PCM streams and the two PCM sequences and between the adaptive differential PCM stream and the adaptive differential PCM sequence in accordance with CCITT Recommendation G.723. In this event, it is possible to use an adaptation speed control circuit as the speed control calculating circuit 35. A quantizer scale factor adaptation circuit serves as the scale factor calculating circuit 37.

A judging device 41 is connected to the scale factor calculating circuit 37 to compare the data optimum scale factor with a predetermined threshold value. When the data optimum scale factor is not greater than the threshold value, the judging device 41 judges that a data signal is used as one of the baseband signals multiplexed into the first and the second input PCM streams from which the first or the second PCM sequence is derived and is being dealt with by the adaptive differential PCM encoder device 23. When the data optimum scale factor is greater than the threshold value, the judging device 41 judges that a voice signal is used as one of the baseband signals that is under processing as a voice component by the adaptive differential PCM encoder device 23. The threshold value may be equal to 5.0.

Before so judging presence and absence of a data component in the first and the second PCM sequences, the judging device 41 may judge which of the voice optimum, the data optimum, and the combination scale factors is supplied thereto from the scale factor calculating circuit 37. This is possible by comparison of these scale factors. At any rate, the judging device 41 produces a result of judgement indicative of presence and absence of the data component in the two PCM sequences.

In practice, the scale factor calculating circuit 37 comprises the above-mentioned low-pass filter and first calculates the voice optimum scale factor. Immediately subsequently, the voice optimum scale factor is caused to pass through the low-pass filter to bring about the data optimum scale fector, which is delivered to the judging device 41 and is used in the meanwhile in calculating the combination scale factor.

A bit number determining device 43 is connected to the judging device 41. Supplied with the result of judgement, the bit number determining device 43 determines a bit number in accordance with presence and absence of the data component in the two PCM sequences to produce a bit number signal representative of the bit number. In the manner which will be described immediately in the following, the bit number signal is used primarily in the adaptive differential PCM encoder 33 on encoding each of the two PCM sequences into one of the first and the second partial adaptive differential PCM sequences.

The baseband signals consist typically of voice and data signals. Under the situations, the result of judgement indicates presence of the voice component in the two PCM sequences when the result of judgement indicates the absence of the data component. It is consequently possible to say that the result of judgement indicates presence of the voice and the data components in the two PCM sequences when the data optimum scale factor is and is not greater than the threshold value, respectively.

Under the circumstances, the above-mentioned bit number will afresh be called a single bit number. The bit number determining device 41 now determines first and second bit numbers collectively as the single bit number when the voice and the data components are present in the two PCM sequences, respectively. The bit number signal is made to represent the first and the second bit numbers one at a time. The bit number signal may alternatively be called first and second bit number signals.

When this alternative expression is used, the bit number determining device 41 produces the first and the second bit number signals one at a time. For the adaptive differential PCM transcoder which deals with the PCM and the adaptive differential PCM streams defined in the above-referenced Recommendation G.761, it is preferred to use three bits and five bits as the first and the second bit numbers, respectively.

Through a first connection 45(1), the bit number signal is delivered to the adaptive differential PCM encoder 33. When the bit number signal represents the first bit number, the adaptive differential PCM encoder 33 encodes each voice component into three bits for use in the first or the second partial adaptive differential PCM sequence. When the bit number signal represents the second bit number, each data component is encoded into five bits for use in the first or the second partial adaptive differential PCM sequence. Such three-bit and five-bit components are subsequently used in the adaptive differential PCM stream in the manner which will presently be described.

The bit number signal is delivered furthermore to the second format transforming circuit 27 through a second connection 45(2). It should clearly be noted in connection with the example being illustrated that such a bit number signal is not multiplexed into the above-mentioned one adaptive differential PCM sequence but is used in making the second format transforming circuit 27 arrange or multiplex the first and the second partial adaptive differential PCM sequences in that one adaptive differential PCM sequence in the manner which will shortly become clear.

Figure 3:
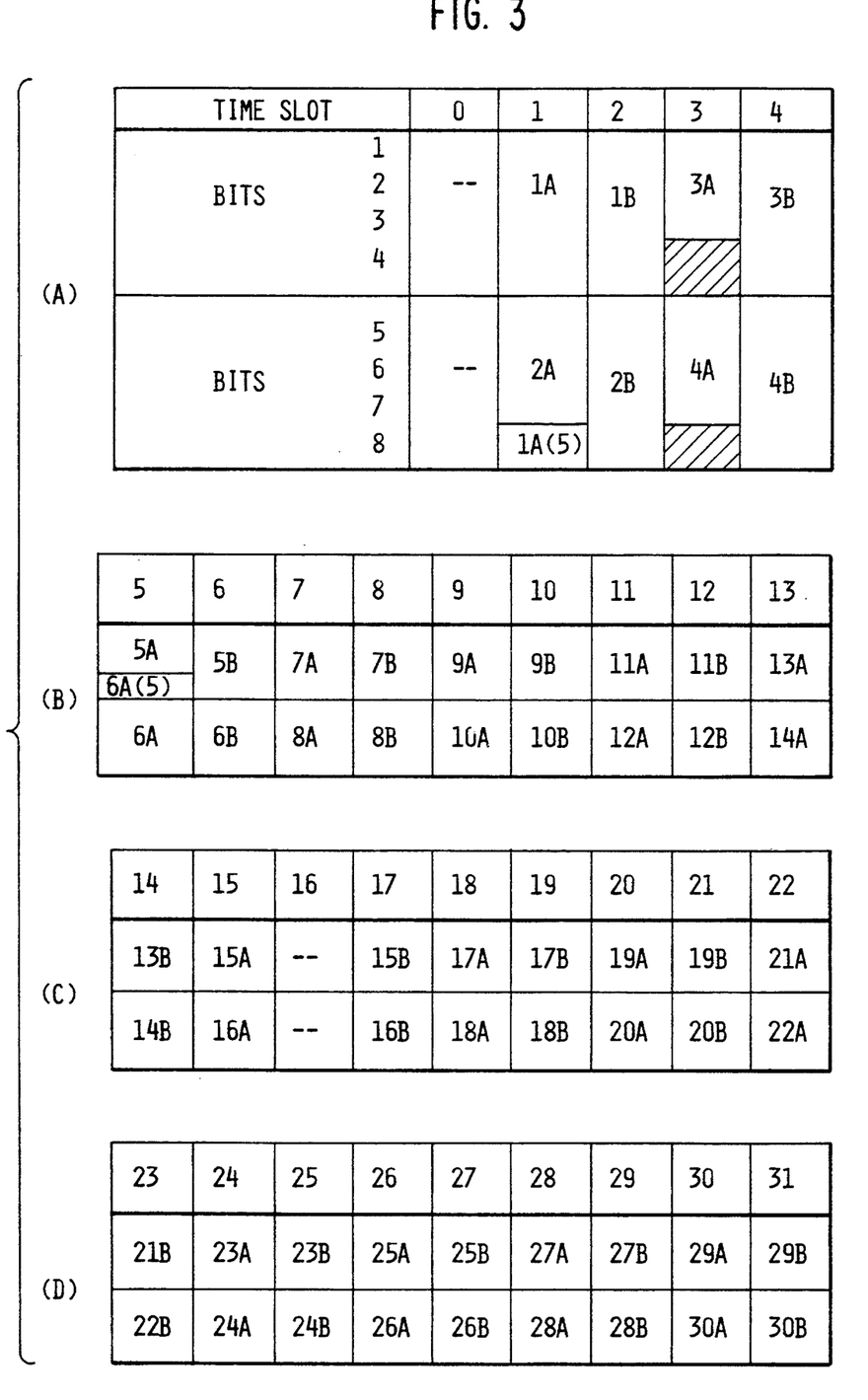
FIG. 3 shows, when parts (A) through (D) are connected to one another in this order from left to right, a frame structure of an adaptive differential PCM stream which is dealt with by the adaptive differential transcoder depicted in FIG. 1.

Turning to FIG. 3 during a short while, it may be mentioned here that the signal format is defined in the above-referenced Recommendation G.761 in Table 1/G.761, which table is not reproduced herein but will presently become clear. This is because the signal format is modified according to this invention in the manner exemplified in the following.

Like in Table 1/G.761, each frame of the outgoing and the incoming adaptive differential PCM streams consists of zeroth through thirty-first eight-bit time slots 0 to 31 as illustrated in FIG. 3 along a first or top row. One of the sixty channels is indicated along a second row and is represented by first through fourth bits 1 to 4. Another of the sixty channels is depicted along a third or bottom row and is represented by fifth through eighth bits 5 to 8 with the bits of each time slot given serial numbers.

Each frame of the first input and output PCM streams consists of first through thirtieth channels 1A to 30A. Each frame of the second input and output PCM streams consists of first through thirtieth channels 1B to 30B.

The voice and the data components will now be called voice PCM components and data PCM components. In the outgoing and the incoming adaptive differential PCM streams, the voice and the data PCM components are voice adaptive differential PCM components and data adaptive differential PCM components.

According to the Recommendation G.761, the second format transforming circuit 27 (FIGS. 1 and 2) multiplexes the first and the second partial adaptive differential PCM sequences in the first through the fifteenth and the seventeenth through the thirty-first time slots, the alarm information in the zeroth time slot, and the signalling information in the sixteenth time slot. It may be mentioned here that the first partial adaptive differential PCM sequence may comprise the adaptive differential PCM components IA through 30A. In this event, the second partial adaptive differential PCM sequence comprises the adaptive differential PCM components 1B through 30B.

In each of the sixty channels of the outgoing and the incoming adaptive differential PCM streams, each time slot consists of first through fourth bits as counted from the most significant bit to the least significant bit. Merely for brevity of the description which follows, attention will be directed to only the first through the sixth channels 1A to 6A of the first input or output PCM stream.

It will be surmised that the first channel represents one of the data PCM components. The second channel represents one of the voice PCM components. The third and the fourth channels represent two consecutive ones of the voice PCM components. The fifth channel represents a different one of the voice PCM components. The sixth channel represents a different one of the data PCM components.

Consisting of three bits, each voice adaptive differential PCM component is represented by first through third bits as counted from its most significant bit to its least significant bit. Each data adaptive differential PCM component is likewise represented by first through fifth bits.

In the manner exemplified in the first time slot, the above-mentioned one of the data PCM components is arranged as the first through the fourth bits of one of the data adaptive differential PCM components. The fifth bit of this one of the data adaptive differential PCM components is put in the fourth bit of the second channel in the manner indicated by a label 1A(5). The fourth bit is among the first through the fourth bits which are representative of the second channel and of which the first through the third bits are used to represent one of the voice adaptive differential PCM components that is derived from the above-mentioned one of the voice PCM components.

The two consecutive ones of the voice PCM components are arranged as two of the voice adaptive differential PCM components. As exemplified in the third time slot, each of these two voice adaptive differential PCM components is represented by the first through the third bits. The fourth bits of the third and the fourth channels are used to represent no signal component. This is indicated by hatched areas.

In the manner exemplified in the fifth time slot, the different one of the voice PCM components is arranged as a different one of the voice adaptive differential PCM components at the first through the third bits of the fifth channel. The different one of the data PCM components is arranged as a different one of the data adaptive differential PCM components at the first through the fourth bits of the sixth channel. The fifth bit of the different one of the data adaptive differential PCM components is put in the fourth bit of the fifth channel as indicated by another label 6A(5).

It may be that an appreciable number of data PCM components consecutively follow one another. In such an event, it is possible to arrange the fifth bit of each of the data adaptive differential PCM components derived from these data PCM components in the fourth bit of a nearest one of the first through the thirtieth channels 1A to 30A and 1B to 30B that represents one of the voice PCM components.

In the manner described above, it is possible to understand that each time slot of the outgoing and the incoming adaptive differential PCM streams represents a signal component. The adaptive differential PCM stream therefore comprises or carries signal components, each of which is arranged in one of the sixty channels and is represented by first through N-th bits as counted from the most significant bit to the least significant bit, where N represents a first predetermined number which is greater than the first bit number and is less than the second bit number and which is preferably equal to or greater than a sum of the first and the second bit numbers. Each of the voice adaptive differential PCM components is represented by first through N(1)-th bits as counted from its most significant bit to its least significant bit, where N(1) represents the first bit number. Similarly, each of the data adaptive differential PCM components is represented by first through N(2)-th bits, where N(2) represents the second bit number. These voice and data adaptive differential PCM components are arranged in the outgoing and the incoming adaptive differential PCM streams in the manner described above.

Turning back to FIG. 2, the first connection 45(1) is for delivering the bit number signal to the adaptive differential PCM encoder 33. The bit number signal makes the adaptive differential PCM encoder 33 encode the voice PCM components into the voice adaptive differential PCM components by using the first bit number and the data PCM components into the data adaptive differential PCM components by using the second bit number.

The second connection 45(2) is for delivering the bit number signal to the second format transforming circuit 27. While supplied with the bit number signal, the second format transforming circuit 27 format transforms the first and the second partial adaptive differential PCM sequences into the one adaptive differential PCM sequence.

More particularly, the bit number signal makes the second format transforming circuit 27 arrange each of the voice adaptive differential PCM components in the adaptive differential PCM sequence as a part of one of the signal components, such as the signal component in the second, the third, or the fourth channels 2A, 3A, or 4A depicted in FIG. 3, by using a plurality of bits which are equal in number to the first bit number and are selected from the first bit consecutively towards N-th bit which first through N-th bits are representative of the above-mentioned one of the signal components. Each of the data adaptive differential PCM components is arranged in the adaptive differential PCM sequence as a different one of the signal components, such as the signal component in the first channel 1A or in the sixth channel 6A, as a part of a further different one of the signal components, such as the signal component in the second channel 2A or the fifth channel 5A, by using at least one bit which is equal in number to the second bit number less the first predetermined number and is selected from the N-th bit consecutively towards the first bit which N-th through first bits are representative of the further different one of the signal components.

Referring back to FIG. 1, attention will now be directed to the general adaptive differential PCM transcoder which is used as the receive side in receiving the incoming adaptive differential PCM stream at the incoming terminal 17 to deliver the first and the second output PCM streams to the first and the second output terminals 13 according to a second embodiment of this invention. Circuit elements are not different from those described before insofar as FIG. 1 is concerned. Operation is, however, reversed.

More specifically, the incoming adaptive differential PCM stream is similar to the outgoing adaptive differential PCM stream. The first and the second output PCM streams are similar to the first and the second input PCM streams.

The adaptive differential PCM line interface circuit 29 is for code converting the transmission codes of the incoming adaptive differential PCM stream to the internal codes. The adaptive differential PCM line interface circuit 29 furthermore extracts the alarm information from the incoming adaptive differential PCM stream for delivery to the first format transforming circuit 21 through the second format transforming circuit 27 and the bidirectional connection 25. The adaptive differential PCM line interface circuit 29 still further corrects the synchronism in the incoming adaptive differential PCM stream.

The second format transforming circuit 27 extracts the signalling information from the adaptive differential PCM stream which is composed of the internal codes with the synchronism corrected and from which the alarm information is extracted. The signalling information is delivered to the first format transforming circuit 21 through the bidirectional connection 25. The second format transforming circuit 27 furthermore format transforms the adaptive differential PCM stream under consideration into two partial adaptive differential PCM sequences, which may be referred to again as the first and the second partial adaptive differential PCM sequences and may collectively called one adaptive differential PCM sequence.

The adaptive differential PCM codec device 23 now serves as an adaptive differential PCM decoder device in the manner which will presently be described. A little more in detail, the adaptive differential PCM decoder device (23) decodes the first and the second partial adaptive differential PCM sequences into two PCM sequences in which the internal codes are used. Like the adaptive differential encoder device, the adaptive differential decoder device comprises the first and the second adaptive differential PCM codecs 23.

The first format transforming circuit 21 format transforms the two PCM sequences into two PCM streams represented by the internal codes. The signalling and the alarm information is introduced into the two PCM streams.

The PCM line interface circuit 19 code converts the internal codes of the two PCM streams to the transmission codes. The PCM line interface circuit 19 thereby supplies the first and the second output terminals 13 with the first and the second output PCM streams represented by the transmission codes.

Figure 4:
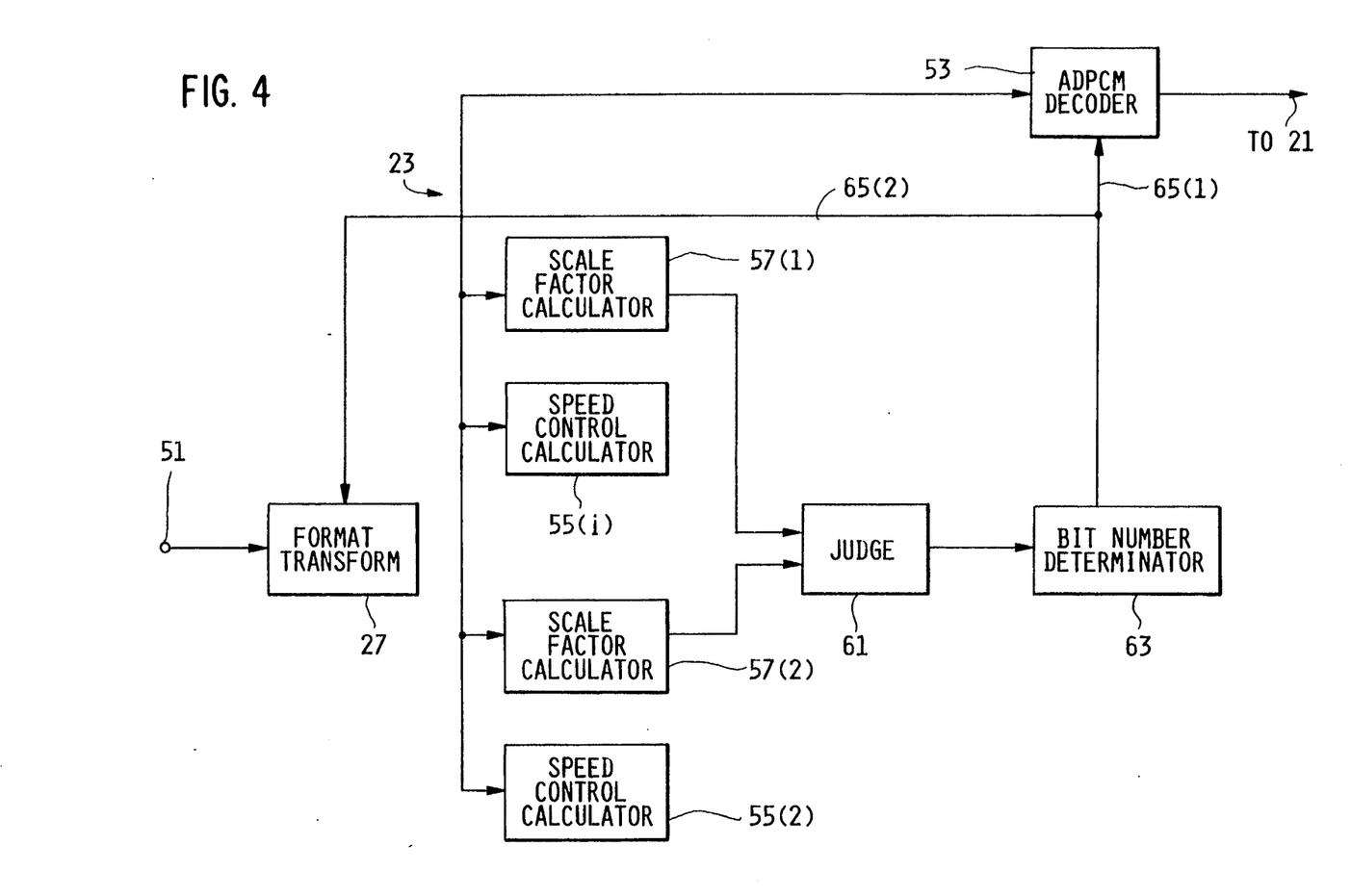
FIG. 4 is a block diagram of a decoder circuit for use according to a second embodiment of this invention in the adaptive differential PCM transcoder shown in FIG. 1.

Referring to FIG. 4, the description will now proceed to an adaptive differential PCM transcoder for use as a decoder circuit. Similar parts are designated by like reference numerals and are similarly operable with likewise named signals. As in FIG. 2, not depicted in FIG. 4 are the first and the second output terminals 13, the incoming terminal 17, and several circuit elements which are described in conjunction with FIG. 1.

A receiver input terminal 51 is supplied from the adaptive differential PCM line interface circuit 29 (FIG. 1) with the adaptive differential PCM stream represented by the internal codes. In the manner which will presently be described, the second format transforming circuit 27 successively produces primary and secondary blocks of bits of one of the first and the second partial adaptive differential PCM sequences. Each primary block consists of a first plurality of bits. Each secondary block consists of a second plurality of bits. It should be noted here that a sum of the first and the second pluralities is not greater than twice a predetermined number. As will later become clear, each primary block is one of the voice adaptive differential PCM component. Each secondary block is one of the data adaptive differential PCM components.

The primary and the secondary bloks are supplied to an adaptive differential PCM decoder 53, to first and second speed control calculating circuits 55(1) and 55(2), and to first and second scale factor calculating circuits 57(1) and 57(2). The speed control calculating circuits will be designated by 55 with suffixes omitted. The scale factor calculating circuits will likewise be designated by 57.

A combination of the first speed control and scale factor calculating circuits 55 and 57 will be referred to as a first scale factor calculating section. Another combination of the second speed control and scale factor calculating circuits 55 and 57 will be called a second scale factor calculating section. An overall combination of the first and the second scale factor calculating sections is herein called a scale factor calculating device.

When supplied with the primary blocks, the first scale factor calculating section calculates the voice optimum scale factor like the scale factor calculating device described in connection with FIG. 2. Similarly, the data optimum scale factor is calculated by the second scale factor calculating section when supplied with the secondary blocks. The scale factor calculating device (55, 57) is therefore for calculating the voice and the data optimum scale factors.

A judging device 61 is connected to the second scale factor calculating circuit 57(2). comparing the data optimum scale factor with a predetermined threshold value, the judging device 61 judges presense and absence of a data component or data adaptive differential PCM component in the adaptive differential PCM sequence when the data optimum scale factor is not and is greater than the threshold value. The judging device 61 thereby produces a result of judgement indicative of the presence and the absence of the data component. In the manner described in connection with the judging device 41 before, it is possible to say that the result of judgement indicates presence of the data and the voice components in the adaptive differential PCM sequence.

In the example being illustrated, the judging device 61 is connected to both the first and the second scale factor calculating sections. In this event, the judging device 61 compares the voice and the data optimum scale factors with the threshold value to produce the result of judgement.

A bit number determining device 63 is connected to the judging device 61. Supplied with the result of judgement, the bit number determining device 63 determines a bit number in accordance with presence of the voice and the data components in the adaptive differential PCM sequence to produce a bit number signal representative of the bit number. In the manner described in connection with FIG. 2, the bit number determining device 63 may determine first and second bit numbers when the result of judgement indicates the presence of the voice and the data components. In this event, the bit number signal represents the first and the second bit numbers one at a time.

The bit number signal is delivered to the second format transforming circuit 27 through a connection which is now referred to herein as a first connection 65(1). Using the bit number signal in the manner described before in conjunction with FIG. 2, the second format transforming circuit 27 format transforms the adaptive differential PCM stream into the first and the second partial adaptive differential PCM sequences. Using the first and the second bit numbers as the first and the second pluralities, the second format transforming circuit 27 produces the primary and the secondary blocks of bits.

The bit number signal is supplied furthermore to the adaptive differential PCM decoder 53 through another connection, which is herein called a second connection 65(2). Using the bit number signal, the adaptive differential PCM decoder 53 decodes the partial adaptive differential PCM sequence into one of the two PCM sequences for delivery to the first format transforming circuit 21.

Reviewing FIGS. 1, 2, and 4, it is now undursteed that the adaptive differential PCM transcoder can encode the first and the second input PCM streams into the outgoing adaptive differential PCM stream. In addition, the adaptive differential PCM transcoder can decode the incoming adaptive differential PCM stream into the first and the second output PCM streams.

Referring to FIG. 1 once again, it is possible to understand that the illustrated adaptive differential PCM transcoder is operable as an adaptive differential PCM encoding circuit according to a third embodiment of this invention. The adaptive differential PCM transcoder is operable furthermore as an adaptive differential PCM decoding circuit according to a fourth embodiment of this invention.

Figure 5:
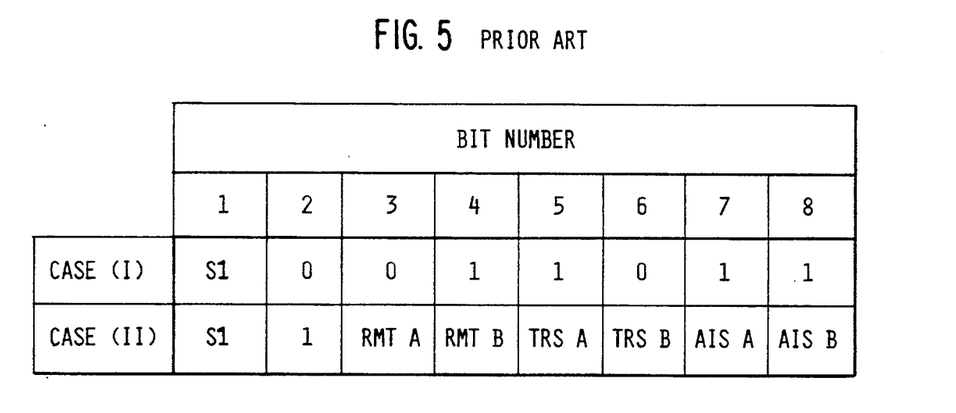
FIG. 5 shows a time slot structure which is used in accordance with CCITT Recommendation G.761 in an adaptive differential PCM stream processed by an adaptive differential PCM transcoder of the type depicted in FIG. 1.

Turning to FIG. 5, the above-referenced CCITT Recommendation G.761 will be reviewed. In connection with the outgoing and the incoming adaptive differential PCM streams, attention will be directed to the zeroth time slot 0 described in conjunction with FIG. 3. The zeroth time slot has different bit structures in first and second cases (I) and (II) where a frame alignment signal is and is not contained in the zeroth time slot. The bit structures are summarised in FIG. 5 by using first through eighth bits 1 to 8.

In FIG. 5, the first bit is an S1 bit which is reserved in both cases for international communication. Ordinarily, the S1 bit is fixed at one. In the first case, the second through the eighth bits are used to represent the frame alignmeant signal by giving zero and one in the manner illustrated. In the second case, the third and the fourth bits are used as RMT A and RMT B bits for transmission of remote alarm associated with the first channel A) and the second (channel B) input and output PCM strams. The fifth and the sixth bits are TRS A and TRS B bits indicative of transparent transfer of the PCM streams. The seventh and the eighth bits are AIS A and AIS B bits for indicating faults.

Figure 6:
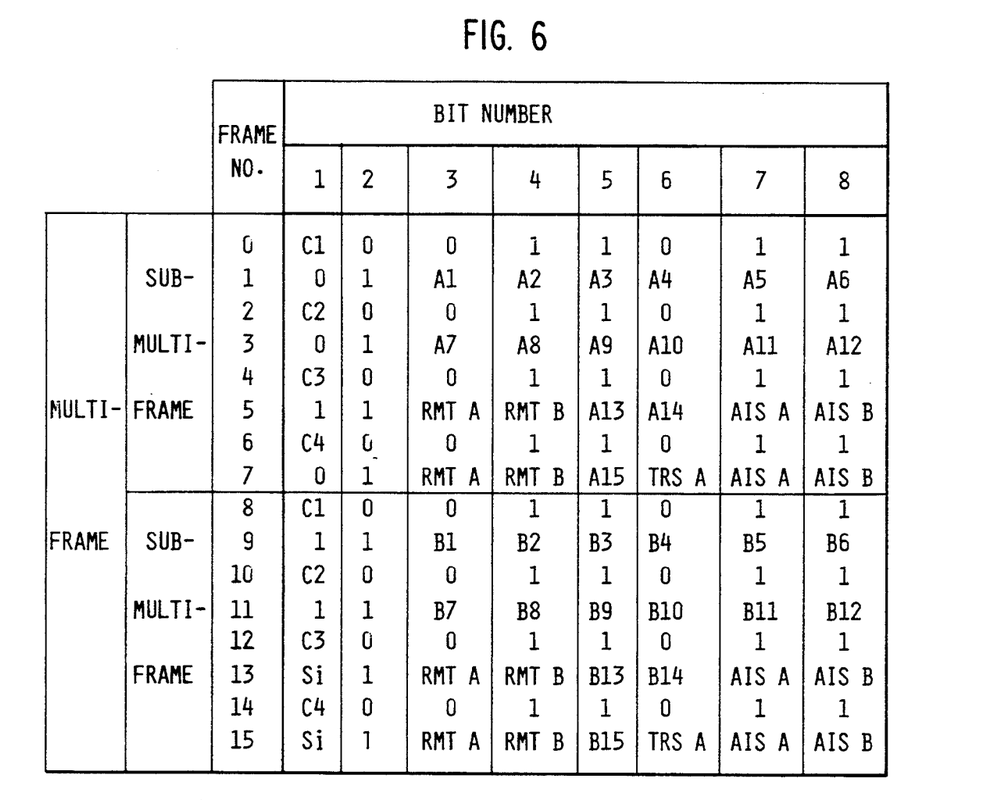
FIG. 6 shows a time slot structure which is used in an adaptive differential PCM stream dealt with by an adaptive differential PCM transcoder according to an aspect of this invention.

Further turning to FIG. 6, it should be mentioned here that each of the outgoing and the incoming adaptive differential PCM streams has a multiframe structure. Each multiframe consists of two submultiframes. Each pair of submultiframes consists of zeroth through fifteenth frames 0 to 15. In these frames, the first through the eighth bits of the zeroth time slot are used as illustrated.

More specifically, the third bit of the zeroth time slot in the first frame is used to transmit the bit number signal related to the first channel 1A of the firrst input or output PCM stream with this bit number signal multiplexed in the outgoing adaptive differential PCM stream and consequently in the incoming adaptive differential PCM stream. In this manner, the bit number signals related to the channels 2A through 15A and 1B through 15B are multiplexed in the outgoing and the incoming adaptive differential PCM streams. Similar bits of the zeroth time slot in the next multiframe are used to transmit the bit number signals related to the channels 16A through 30A and 16B through 30B.

In this manner, the zeroth time slot of each of odd-numbered frames of two consecutive multiframes is used to transmit the bit number signals for the first through the thirtieth channels of each of the first and the second PCM sequences and is furthermore used in accordance with the second case (II) described in connection with FIG. 5. The zeroth time slot of each of even-numbered frames in each submultiframe is used according to the first case (I) in transmitting the frame alignment signal.

Figure 7:
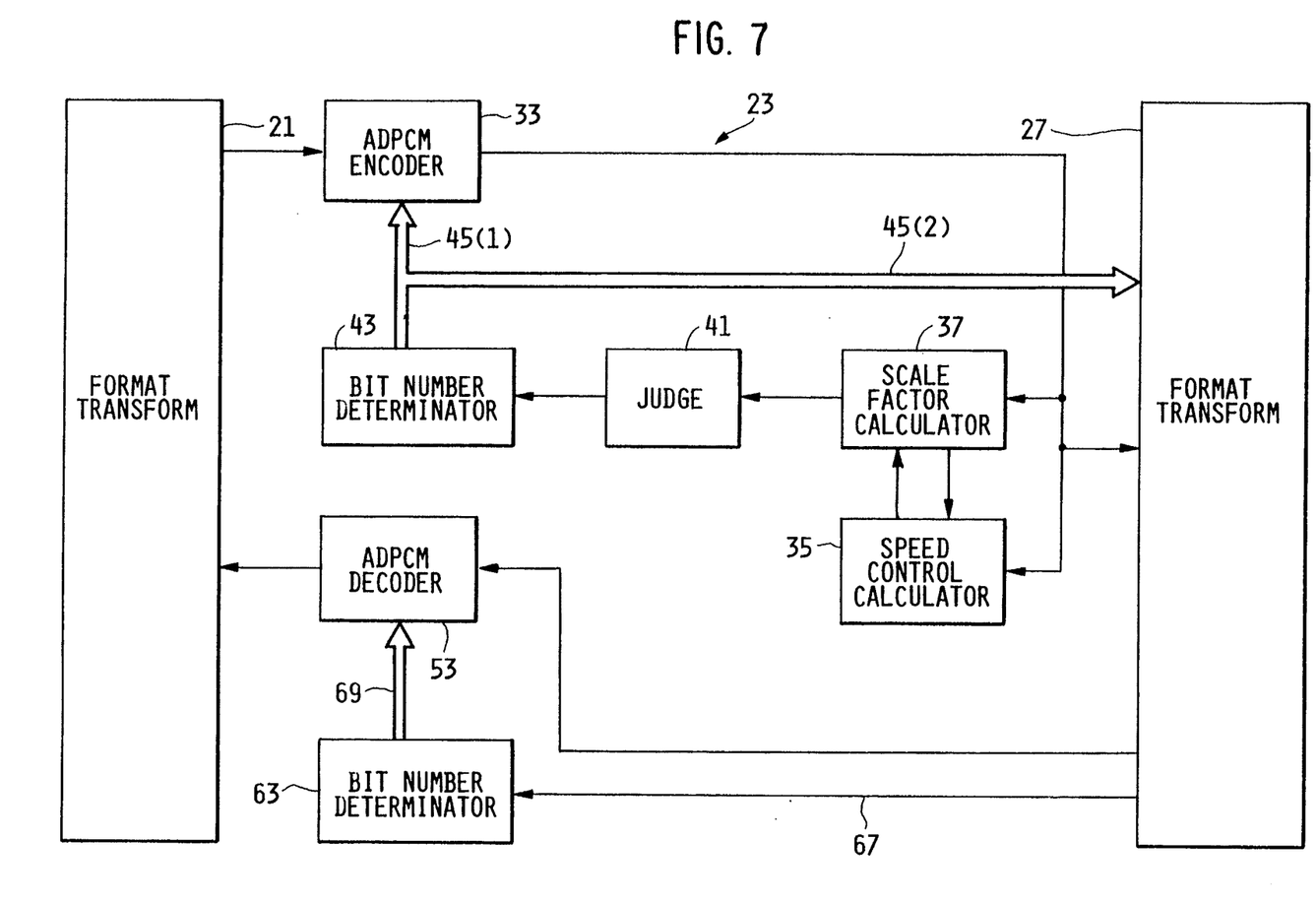
FIG. 7 is a block diagram of an adaptive differential PCM transcoder mentioned in connection with FIG. 6.

Referring now to FIG. 7, an adaptive differential PCM encoder and decoder circuit comprises similar parts which are designated by like reference numerals and are similarly operable with likewise named signals. It should be understood that the first or the second adaptive differential PCM codec device 23 of FIG. 1 comprises the adaptive differential PCM encoder and decoder 33 and 53 and that the bidirectional connection 25 (FIG. 1) is omitted merely for simplicity of illustration.

In contrast to the encoder and the decoder circuits illustrated with reference to FIGS. 2 and 4, the illustrated encoder and decoder circuit comprises the second format transforming circuit 27 which multiplexes the bit number signal supplied thereto through the second connection 45(2) into the outgoing adaptive differential PCM stream. The second format transforming circuit 27 furthermore demultiplexes the bit number signal from the incoming adaptive differential PCM stream for supply to the bit number determining device 63 through a bit number signal lead 67. The bit number signals are multiplexed and demultiplexed like the S1 and other conventional bits described in conjunction with FIG. 5. It is therefore believed that no detailed description is necessary in this respect.

Reviewing FIGS. 1, 3, 6, and 7, it is possible to understand that the outgoing or the incoming adaptive differential PCM stream is represented by successive frames, such as the zeroth through the fifteenth frames 0 to 15 depicted in FIG. 6. More particularly, the adaptive differential PCM stream comprises or carries adaptive differential PCM signal components arranged in a predetermined number of time slots, such as the zeroth through the thirty-first time slots 0 to 31 of FIG. 3, in each of the adaptive differential PCM frames. Each of the adaptive differential PCM signal components consists of a plurality of bits, N in number, where N represents the predetermined number which is typically equal to four and will now be referred to as a first predetermined number.

Each of the first and the second input and output PCM streams is represented by successive PCM frames, such as the first through the thirtieth frames described in conjunction with FIG. 3. In other words, each of the two PCM sequences repeatedly comprises or carries first through M-th PCM signal components, there M represents a second predetermined number which is greater than the first predetermined number, being typically equal to thirty.

On the send side, the bit number determining device 42 produces first through M-th bit number signals related to or in connection with the first through the M-th PCM signal components. An m-th bit number signal represents the first and the second bit numbers one at a time, where m is variable between 1 and M, both inclusive. More in detail, the m-th bit number signal may represent the first bit number in one of the PCM frames and the second bit number in another of the PCM frames.

In the manner described above, the second connection 45(2) makes the format transforming device (21, 25, 27) format transform the adaptive differential PCM sequence into the adaptive differential PCM stream represented by the internal codes. More specifically, the second connection 45(2) makes the format transforming device arrange or multiplex the first through the M-th bit number signals in predetermined ones of the bits, such as the third through the eighth bits, of one of the adaptive differential PCM signal components that is arranged in a predetermined one of the time slots, such as the zeroth time slot, of each of at least two of the adaptive differential PCM frames. In the example illustrated with reference to FIG. 6, the above-mentioned at least two of the adaptive differential PCM frames are the first through the seventh and the ninth through the fifteenth frames of one of the submultiframes and similar frames of another of the submultiframes that immediately follows the first-mentioned one of the submultiframes.

Broadly speaking, the outgoing or the incoming adaptive differential PCM stream comprises signal components arranged in successive frames. The second connection 45(2) is for making the format transforming device produce the adaptive differential PCM stream by making a predetermined one of the signal components, such as that arranged in the zeroth time slot, in each of the frames represent the bit number signal.

On the receive side, the format transforming device 65 format transforms the incoming adaptive differential PCM stream into a bit number signal representative of a bit number, which is represented by first and second codes one at a time. The bit number determining device 63 uses the bit number signal in determining a decoded number, such as one of the first and the second bit numbers. The bit number determining device 63 thereby produces a bit number control signal representative of the decoded number. Corresponding to the above-described second connection 65(2), a connection 69 supplies the bit number control signal to the adaptive differential PCM decoder 53 to make the adaptive differential PCM decoder 53 use the decoded number in decoding the adaptive differential PCM sequence into one of the two PCM sequences.

In connection with FIGS. 1 through 4, 6, and 7, it is now understood that an adaptive defferential PCM transcoder is implemented according to this invention by addition of only a small number of circuit elements to a conventional adaptive differential PCM transcoder and by modification of the second format transforming circuit 27. Added circuit elements are, in FIGS. 2 and 4, the judging devices 41 and 61 and the bit number determining devices 43 and 63 and, in FIG. 7, the judging device 41 and the bit number determining devices 43 and 63. It will readily be understood in connection with modification of the second format transforming circuit 27 that a least significant bit detecting circuit (not shown) should be added to detect the least significant bit of the voice and the data PCM or adaptive differential PCM component. A bit number calculating circuit (not shown) should be added and controlled by the bit number signal to count the bit numbers for use in arranging or deriving the first through the N(1)-th or the N(2)-th bits.

While this invention has thus far been described in specific conjunction with a few preferred embodiments thereof, it will now be readily possible for one skilled in the art to carry this invention into effect in various other manners. For example, the signal format may be defined by CCITT Recommendation G.762. It is possible to modify in various ways the time slot structure illustrated with reference to FIG. 6. From the foregoing, it should be understood in connection with selection of at least one bit from the N-th bit consecutively towards the first bit that an (N+1)-th bit of the data adaptive differential PCM component is preferably placed as nearest possible to the first bit with the N(2)-th bit placed as most farther away from the first bit.

What is claimed is:

1. An adaptive differential PCM transcoder which is for code converting two PCM streams to one adaptive differential PCM stream and which includes an adaptive differential PCM encoder device for encoding two PCM sequences into one adaptive differential PCM sequence and a format transforming device for format transforming said two PCM streams into said two PCM sequences and said adaptive differential PCM sequence into said adaptive differential PCM stream, said adaptive differential PCM transcoder comprising:

a scale factor calculating device for using said adaptive differential PCM sequence in calculating a voice optimum scale factor and a data optimum scale factor;

a judging device for comparing said data optimum scale factor with a predetermined threshold value to judge presence and absence of a data component in said two PCM sequences;

a bit number determining device for selecting a bit number in accordance with the absence and the presence of said data component to produce a bit number signal representative of said bit number;

a first connection for supplying said bit number signal to said adaptive differential PCM encoding device to make said adaptive differential PCM encoder device use said bit number in encoding said two PCM sequences into said adaptive differential PCM sequence; and a second connection for supplying said bit number signal to said format transforming device to make said format transforming device use said bit number in format transforming said adaptive differential PCM sequence into said adaptive differential PCM stream.

2. An adaptive differential PCM transcoder as claimed in claim 1, said two PCM sequences comprising voice PCM components and data PCM components, wherein:

said judging device is for judging presence of said voice and said data PCM components in said two PCM sequences by comparison of said data optimum scale factor with said threshold value to produce a result of judgement indicative of presence of said voice and said data PCM components;

said bit number determining device determining, collectively as said bit number, first and second bit numbers when said result of judgement indicates the presence of said voice and said data PCM components, said first bit number plus said second bit number being not greater than a predetermined number;

said first connection making said adaptive differential PCM encoder device encode said voice PCM components into voice adaptive differential PCM components by using said first bit number and said data PCM components into data adaptive differential PCM components by using said second bit number to make said adaptive differential PCM sequence comprise said voice and said data adaptive differential PCM components.

3. An adaptive differential PCM transcoder as claimed in claim 2, said adaptive differential PCM stream comprising signal components, each of said signal components being represented by first through N-th bits as counted from a most significant bit to a least significant bit, where N represents said predetermined number, said first bit number being less than said predetermined number, said second bit number being greater than said predetermined number, wherein said second connection is for making said format transforming device arrange each of said voice adaptive differential PCM components as a part of one of said signal components by using a plurality of bits which are equal in number to said first bit number and are selected consecutively from the first bit towards the N-th bit representative of said one of the signal components and arrange each of said data adaptive differential PCM components as a different one of said signal components and a part of a further different one of said signal components by using at least one bit which is equal in number to said second bit number less said predetermined number and is selected consecutively from the N-th bit towards the first bit representative of said further different one of the signal components.

4. An adaptive differential PCM transcoder as claimed in claim 3, said predetermined number being equal to four, wherein:

said first bit number is equal to three;

said second bit number being equal to five.

5. An adaptive differential PCM transcoder as claimed in claim 3, wherein said second connection is for making said format transforming device produce said adaptive differential PCM stream without using said bit number signal as a signal component of said adaptive differential PCM stream.

6. An adaptive differential PCM transcoder as claimed in claim 3, said adaptive differential PCM stream comprising signal components arranged in frames, wherein said second connection is for making said format transforming device produce said adaptive differential PCM stream by making a predetermined one of the signal components in each of said frame represent said bit number signal.

7. An adaptive differential PCM transcoder as claimed in claim 1, said adaptive differential PCM stream comprising adaptive differential PCM signal components arranged in time slots in each of successive adaptive differential PCM frames, each of said adaptive differential PCM signal components consisting of a plurality of bits, N in number, where N represents a first predetermined number, each of said two PCM streams repeatedly comprising first through M-th PCM signal components, where M represents a second predetermined number which is greater than said first predetermined number, wherein:

said bit number determining device is for producing first through M-th bit number signals related to said first through said M-th PCM signal components, each of said first through said M-th bit number signals representing said bit number;

said second connection making said format transforming device format transform said adaptive differential PCM sequence into said adaptive differential PCM stream by arranging said first through said M-th bit number signals in predetermined ones of the bits of one of said adaptive differential PCM signal components that is arranged in a predetermined one of the time slots in each of at least two of said adaptive differential PCM frames.

8. An adaptive differential PCM transcoder which is for code converting one adaptive differential PCM stream to two PCM streams and which includes an adaptive differential PCM decoder device for decoding one adaptive differential PCM sequence into two PCM sequences and a format transforming device for format transforming said one adaptive differential PCM stream into said one adaptive differential PCM sequence and said two PCM sequences into said two PCM streams, said adaptive differential PCM transcoder comprising:

a scale factor calculating device for using said adaptive differential PCM sequence in calculating a voice optimum scale factor and a data optimum scale factor;

a judging device for comparing said data optimum scale factor with a predetermined threshold value to judge presence and absence of a data component in said adaptive differential PCM sequence;

a bit number determining device for selecting a bit number in accordance with the absence and the presence of said data component to produce a bit number signal representative of said bit number;

a first connection for supplying said bit number signal to said format transforming device to make said format transforming device use said bit number on format transforming said adaptive differential PCM stream into said adaptive differential PCM sequence; and a second connection for supplying said bit number signal to said adaptive differential PCM decoder device to make said adaptive differential PCM decoder device use said bit number in decoding said adaptive differential PCM sequence into said two PCM sequences.

9. An adaptive differential PCM transcoder which is for code converting one adaptive differential PCM stream to two PCM streams and which includes an adaptive differential PCM decoder device for decoding one adaptive differential PCM sequence into two PCM sequences and a format transforming device for format transforming said adaptive differential PCM streams into said adaptive differential PCM sequence and said two PCM sequences into said two PCM streams, wherein:

said format transforming device is for format transforming said adaptive differential PCM stream furthermore into a bit number signal representative of a bit number;

said adaptive differential PCM transcoder comprising:

a bit number determining device for using said bit number signal in determining a decoded number to produce a bit number control signal representative of said decoded number; and a connection for supplying said bit number control signal to said adaptive differential PCM decoder device to make said adaptive differential PCM decoder device use said decoded number in decoding said adaptive differential PCM sequence into said two PCM sequences.

* * * * *